Figure 1:
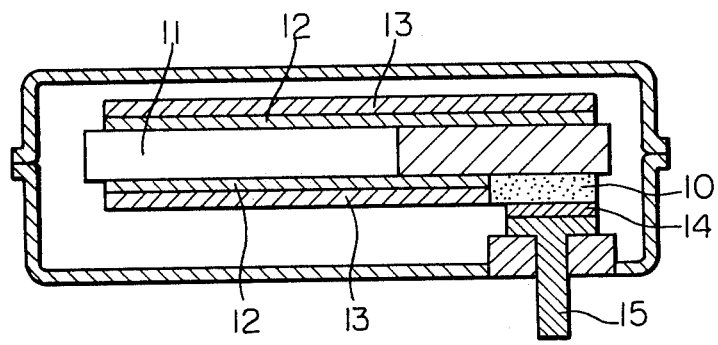

United States Patent [19]

Noguchi et al.

[11] 4,259,607
[45] Mar. 31, 1981

[54] QUARTZ CRYSTAL VIBRATOR USING NI-AG OR CR-NI-AG ELECTRODE LAYERS

[75] Inventors: Kazuo Noguchi, Tokyo; Makoto Wakasugi; Fumio Kohyama, both of Tokorozawa, all of Japan

[73] Assignee: Citizen Watch Co., Ltd., Tokyo, Japan

[21] Appl. No.: 916,619

[22] Filed: Jun. 19, 1978

[30] Foreign Application Priority Data

Jun. 24, 1977 [JP]  Japan ............................. 52-82453[U]

[51] Int. Cl.² ........................................... H01L 41/10
[52] U.S. Cl. .................................................. 310/364
[58] Field of Search ............... 310/311, 312, 364, 370, 310/348

[56] References Cited

U.S. PATENT DOCUMENTS

| | | | |
|---|---|---|---|
| 2,641,718 | 6/1953 | Samuelson | 310/364 X |
| 3,317,762 | 5/1967 | Corwin et al. | 310/364 X |
| 3,481,014 | 12/1969 | Noren | 310/364 X |
| 3,831,043 | 8/1974 | Hoffmann et al. | 310/364 X |
| 3,891,873 | 6/1975 | Yanagisawa et al. | 310/364 |
| 4,080,696 | 3/1978 | Shimatsu | 58/23 TF |

OTHER PUBLICATIONS

*Piezoelectric Ceramics*, by Jaffe, Cook & Jaffe, Academic Press, N.Y., 1971, pp. 262–263.

*Primary Examiner*—Mark O. Budd
*Attorney, Agent, or Firm*—Jordan and Hamburg

[57] ABSTRACT

A structure of an electrode film deposited on a tuning fork-type quartz crystal vibrator in which an electrode film on a tuning fork-type quartz crystal vibrator has a laminated structure obtained by forming, in the order mentioned, three overlapping layers, namely layers of chrome, nickel and silver, or two overlapping layers, namely layers of nickel and silver, on the surface of a tuning fork-shaped quartz crystal from the side nearest thereto, and in which the thickness of each layer of the electrode film is less than 300 Å for the chrome layer, less than 500 Å for the nickel layer, and less than 2000 Å for the silver layer.

4 Claims, 3 Drawing Figures

QUARTZ CRYSTAL VIBRATOR USING NI-AG OR CR-NI-AG ELECTRODE LAYERS

This invention relates to tuning fork-type quartz crystal vibrators and, more particularly, to an electrode film structure for these vibrators.

Conventional tuning fork-type quartz crystal vibrators have a tuning fork-shaped quartz crystal formed with thin films of chrome and gold. The quartz crystal vibrators of this type are quite expensive to manufacture and provides a complicated electrode formation procedure due to its inherent structure at a foot portion of the tuning fork-shaped quartz crystal as will be subsequently described in detail.

It is, therefore, an object of the present invention to provide an improved tuning fork-type quartz crystal vibrator which can overcome the shortcomings encountered in prior art.

It is another object of the present invention to provide an improved tuning fork-type quartz crystal vibrator which is easy to manufacture.

It is another object of the present invention to provide an improved tuning fork-type quartz crystal vibrator which is low in manufacturing cost.

Figure 2:
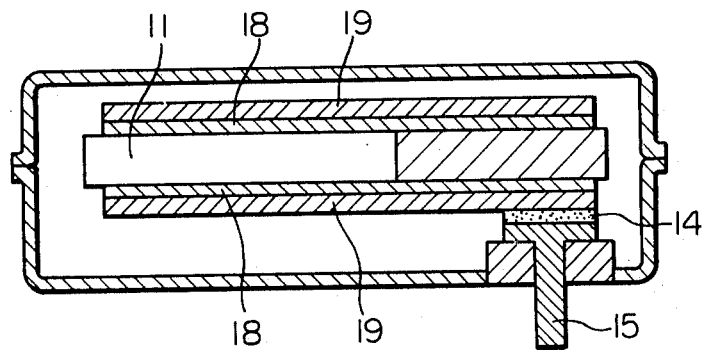
Figure 3:
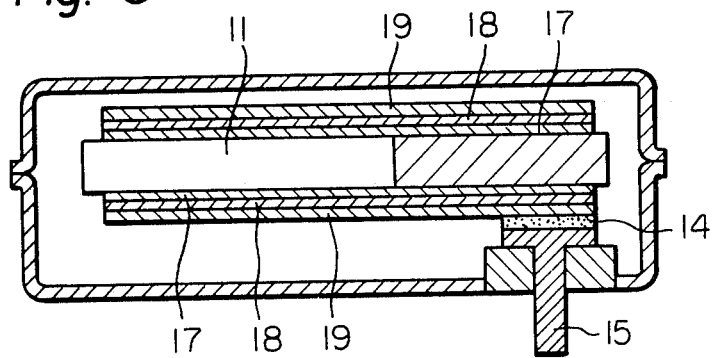

These and other objects, features and advantages of the present invention will become more apparent from the following description when taken in conjunction with the accompanying drawings, in which:

FIG. 1 is a cross-sectional view of a tuning fork-type quartz crystal vibrator having an electrode film structure in accordance with the prior art; and FIGS. 2 and 3 are cross-sectional views of two different embodiments of a tuning fork-type quartz crystal vibrator having an electrode structure in accordance with the present invention.

Referring to FIG. 1, there is shown a prior art tuning fork-type quartz crystal vibrator. Owing to such factors as adhesion to a quartz crystal surface, aging characteristics, CI value and the constants of an equivalent circuit, electrode films for tuning fork-type quartz crystal vibrators have heretofore been formed according to the art by depositing a thin chrome film 12 onto the surface of a tuning fork-shaped quartz crystal 11 by vapor deposition or sputtering, and then forming a thin film 13 of gold on the surface of the chrome layer 12 by means of vapor deposition, sputtering or the like. Since the electrode formed at the point of support of the quartz crystal 11 must be connected to a lead terminal 15 by means of solder 14 or the like, it was necessary to form, by means of vapor deposition or sputtering or a similar technique, a thin film 10 made of a material which would not fuse with the solder but which exhibited good wettability with respect thereto.

A major defect with regard to a tuning fork-shaped quartz crystal having an electrode structure of the type described was the high cost of the metal used to fabricate the electrodes. When silver was adopted as the electrode material instead of the more expensive gold, the poor adhesion between the silver and chrome led to peeling, so that the mere substitution of silver for gold as the electrode material was not possible.

Another defect of the structure mentioned above was the fact that it was necessary to exchange the mask used for vapor deposition at the regions defined by thin films 12, 13 and the region defined by thin film 10. This fact complicated the electrode formation procedure and was an obstacle to cost reduction.

The present invention contemplates the provision of a quartz crystal vibrator capable of being manufactured at low cost but which exhibits the same level of performance as the prior art tuning fork-type quartz crystal vibrator having an electrode film consisting of chrome and gold.

FIG. 2 is a cross-sectional view of a first preferred embodiment of the structure of a quartz crystal vibrator according to the present invention. One feature of this structure is the fact that a thin nickel film 18 is formed on the surface of a tuning fork-shaped quartz crystal 11. A thin film of silver 19 is formed thereover. Although the thin nickel film 18 generally exhibits a weaker adhesion to quartz than a thin film of chrome, an adhesion close to that of a thin chrome film can be obtained by appropriately selecting the temperature and film thickness at the time of vapor deposition. At the same time, the thin nickel film 18 exhibits a far greater adhesion to a thin film of silver 19 than does a thin chrome film. Further, experiments have shown that aging characteristics, CI value and equivalent circuit constants which are quite favorable are obtained by a thin nickel film having a thickness of less than 500 Å. More specifically, the thickness of the nickel film 18 is preferably selected to have a value of 100 Å, and the silver film 19 is selected to have a thickness of 1500 Å. Deposition of the nickel film 18 was performed at a temperature of about 150° C., and the silver film 19 was deposited at a temperature of about 100° C.

FIG. 3 is a cross-sectional view of another embodiment of a quartz crystal vibrator according to the present invention. According to this structure, a thin chrome film 17 is formed between a thin nickel film 18 and the surface of the quartz crystal 11, providing adhesion between the quartz and metal film which is equivalent to that of the prior art tuning fork-type quartz crystal vibrator. Excellent adhesion is also obtained between the thin chrome film 17 and thin nickel film 18. A silver layer 19 is formed thereover.

The practical limits upon the thickness of the chrome, nickel and silver films employed in the present invention are as follows as determined by experimentation. Chrome: less than 300 Å; nickel: less than 500 Å.; silver: less than 2000 Å. Experiments have shown that the most favorable results were obtained by selecting the thickness of the chrome, nickel and silver films to be 100 Å, 200 Å and 1500 Å, respectively, while the chrome and nickel films were deposited at a temperature of about 150° C. and the silver film was deposited at a temperature of about 100° C.

One advantage of the present invention is a reduction in the purchasing cost of raw materials to a figure which is 1/15 to 1/20 of the original cost. This can be attained by providing means for exchanging the materials used to fabricate the electrode films without sacrificing the performance of the vibrator. Moreover, if the solder 14 contains silver the silver layer 19 does not fuse into the solder 14, and an improvement in the yield of the soldering operation is also obtained. Another advantage is that since the deposition of materials are performed at the temperature of about 150° C., the thermal distortion of the evaporating unit is relatively low in degree and, therefore, the evaporating unit as well as other equipments disposed within that unit will have a long life as attained by conventional counter parts.

The gist of the present invention as described above thus resides in forming an electrode film by depositing, in the order mentioned, three overlapping layers, namely layers of chrome, nickel and silver, or two overlapping layers, namely layers of nickel and silver, on the surface of a tuning fork-shaped quartz crystal. The thickness of each layer of the electrode film is less than 300 Å for the chrome layer, less than 500 Å for the nickel layer, and less than 2000 Å for the silver layer.

What is claimed is:

1. A tuning fork-type quartz crystal vibrator comprising:

a tuning fork-shaped quartz crystal; and an electrode formed on a surface of said quartz crystal and including a thin nickel film deposited directly on upper and lower surfaces of said quartz crystal, and a silver film deposited on said nickel film, wherein said thin nickel film has a thickness of less than 500 Å and said silver film has a thickness less than 2000 Å.

2. A tuning fork-type quartz crystal vibrator as claimed in claim 1, in which said thin nickel film is deposited at a temperature of about 150° C., and said silver film is deposited at a temperature of about 100° C.

3. A tuning fork-type quartz crystal vibrator comprising:

a tuning fork-shaped quartz crystal; and an electrode formed on a surface of said quartz crystal and including a thin chrome film deposited directly on the surface of said quartz crystal, a thin nickel film deposited on said thin chrome film and a silver film deposited on said thin nickel film, wherein said thin chrome film has a thickness of less than 300 Å, said nickel film has a thickness of less than 500 Å, and said silver film has a thickness less than 2000 Å.

4. A tuning fork-type quartz crystal vibrator as claimed in claim 3, in which said chrome film is deposited at a temperature of about 150° C., said nickel film is deposited at a temperature of about 150° C., and said silver film is deposited at a temperature of about 100° C.

* * * * *